(12) United States Patent
Cao

(10) Patent No.: US 7,202,145 B2
(45) Date of Patent: Apr. 10, 2007

(54) STRAINED SI FORMED BY ANNEAL

(75) Inventor: Min Cao, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 173 days.

(21) Appl. No.: 10/860,165

(22) Filed: Jun. 3, 2004

(65) Prior Publication Data

US 2005/0272229 A1 Dec. 8, 2005

(51) Int. Cl.
*H01L 21/20* (2006.01)
(52) U.S. Cl. ............... 438/509; 438/799; 257/E21.102
(58) Field of Classification Search ............... 438/478
See application file for complete search history.

(56) References Cited

U.S. PATENT DOCUMENTS

| 5,273,930 A | | 12/1993 | Steele et al. | |
|---|---|---|---|---|
| 5,461,243 A | * | 10/1995 | Ek et al. ................. | 257/190 |
| 5,891,769 A | | 4/1999 | Liaw et al. | |
| 6,313,016 B1 | | 11/2001 | Kibbel et al. | |
| 6,562,736 B2 | * | 5/2003 | Yanagawa et al. .......... | 438/795 |
| 6,878,610 B1 | * | 4/2005 | Lin et al. ................. | 438/478 |
| 2002/0090772 A1 | * | 7/2002 | Higashi ................... | 438/166 |
| 2004/0227158 A1 | * | 11/2004 | Delhougne et al. ......... | 257/202 |
| 2004/0245552 A1 | * | 12/2004 | Shiono et al. ............. | 257/288 |

* cited by examiner

*Primary Examiner*—Stephen W. Smoot
(74) *Attorney, Agent, or Firm*—Duane Morris LLP

(57) ABSTRACT

A semiconductor structure includes a silicon substrate layer, a relaxed silicon-germanium layer on the silicon substrate layer and a strained single crystal silicon layer on the silicon-germanium layer. The silicon-germanium layer may include a thickness of 500 angstroms or less. The method for forming the semiconductor structure includes epitaxially forming the silicon-germanium layer and the single crystal silicon layer. The silicon-germanium layer is stressed upon formation. After the single crystal silicon layer is formed over the silicon-germanium layer, an RTA or laser heat treatment process selectively melts the silicon-germanium layer but not the single crystal silicon layer. The substantially molten silicon-germanium relaxes the compressive stresses in the silicon-germanium layer and yields a relaxed silicon-germanium layer and a strained single crystal silicon layer upon cooling.

15 Claims, 2 Drawing Sheets

US 7,202,145 B2

STRAINED SI FORMED BY ANNEAL

FIELD OF THE INVENTION

This invention relates, in general, to semiconductor processing and more particularly, to methods for forming multilayer structures with strained heterojunctions in semiconductor devices.

BACKGROUND OF THE INVENTION

Strained semiconductor heterostructures are useful for a wide variety of device applications where a narrowed bandgap can improve device performance. Multilayer semiconductor structures comprising heterojunctions are useful in the fabrication of numerous different electronic and optoelectronic devices, one of the most significant electronic devices being bipolar transistors. Strained heterojunction semiconductor devices are also advantageously used as the channel or source/drain regions of PMOS or NMOS metal oxide semiconductor field effect transistors (MOSFET's). For example, in heterojunction MOSFET devices, a strained channel region enhances carrier mobility within the channel. In strained silicon channel regions, the strained silicon layer typically is formed on a substrate layer of greater lattice parameters than that of silicon. A relaxed silicon-germanium layer is a suitable material for such a substrate layer because of its compatibility with silicon processing. As such, a strained silicon layer formed over a relaxed silicon-germanium layer is particularly advantageous.

One known approach to forming a strained silicon channel layer involves growing a silicon layer on an as-grown relaxed or unstrained SiGe layer. The relaxed SiGe layer is formed by first growing a graded $Si_{1-x}Ge_x$ layer on a silicon substrate where x increases from 0% to 30% over a thickness of about 1.5 microns. Next, a 1.0 micron layer of $Si_{0.7}Ge_{0.3}$ is grown over the graded layer following a thin $Si_{1-x}Ge_x$ layer where x decreases from 30% to 0% over a thickness of about 0.03 microns. This approach has several disadvantages including a high epitaxial film cost because it takes approximately 6–8 hours to grow the different layers. Additionally, this approach results in a high concentration of dislocations because of the thick expitaxial layers. In addition to reducing the concentration of such dislocations and reducing costs, a thinner $Si_{1-x}Ge_x$ epitaxial layer provides improved heat conduction, reduced junction capacitance and reduced junction leakage.

Accordingly, methods are needed for forming multilayer heterojunction devices having strained silicon layers formed on relaxed layers, and low defect levels. It would be further advantageous to utilize thinner epitaxial layers for such a purpose.

SUMMARY OF THE INVENTION

To achieve these and other objects, and in view of its purposes, the invention provides a method for forming a semiconductor structure. The method includes providing a substrate having a silicon surface, epitaxially forming a stressed silicon-germanium layer on the silicon surface and epitaxially forming a silicon layer on the silicon-germanium layer. The method further compromises heat treating, thereby converting the stressed silicon-germanium layer to a relaxed silicon-germanium layer and creating strain in the silicon layer.

In another embodiment, the invention provides a method for forming a semiconductor structure. The method includes providing a silicon layer on the substrate, forming a relaxed silicon-germanium layer on the silicon layer and forming a strained single crystal silicon layer on the silicon-germanium layer using epitaxial formation.

In another embodiment, the invention provides a semiconductor structure of a bulk silicon substrate layer, a relaxed silicon-germanium layer disposed on the bulk silicon substrate layer and including a thickness no greater than 500 angstroms and a strained single crystal silicon layer disposed on the silicon-germanium layer.

In yet another exemplary embodiment, the invention provides a semiconductor structure including a silicon layer, a silicon-germanium layer disposed on the silicon layer and a single crystal silicon layer disposed over the silicon-germanium layer. At least a portion of the silicon-germanium layer is substantially molten and the substantially molten portion extends from the silicon layer to the single crystal silicon layer.

In still another embodiment, the present invention provides a semiconductor structure including a silicon-germanium layer formed on a silicon substrate layer and a single crystal silicon layer formed on the silicon-germanium layer. The silicon-germanium layer and single crystal silicon layer are heat treated in one heating operation to enable the silicon-germanium layer to exhibit relaxed properties and the single crystal silicon layer to exhibit strained properties.

BRIEF DESCRIPTION OF THE DRAWING

The invention is best understood from the following detailed description when read in conjunction with the accompanying drawing. It is emphasized that, according to common practice, the various features of the drawing are not necessarily to scale. On the contrary, the dimensions of the various features may arbitrarily be expanded or reduced for clarity. Like numerals denote like features throughout the specification and drawing. Included are the following figures.

DETAILED DESCRIPTION

The present invention provides a method for forming multi-layered structures with strained heterojunctions, in semiconductor devices. A heterojunction is an electronic junction between materials of different bulk composition. Such strained semiconductor heterostructures are useful in a wide variety of device applications in semiconductor manufacturing, particularly those which benefit from enhanced carrier mobility within the structure. The invention is not limited to any particular application or structure and may find application in various optoelectronic devices and electronic devices. The strained heterojunction semiconductor devices of the present invention may be used, for example, in bipolar transistors or MOSFET's, particularly in the source/drain and/or channel regions of MOSFET's. The present invention provides an exemplary multi-layer $Si/Si_{1-x}Ge_x/Si$ heterojunction sandwich structure in which at least the silicon-germanium and upper silicon layers are formed by epitaxial growth.

Figure 1:
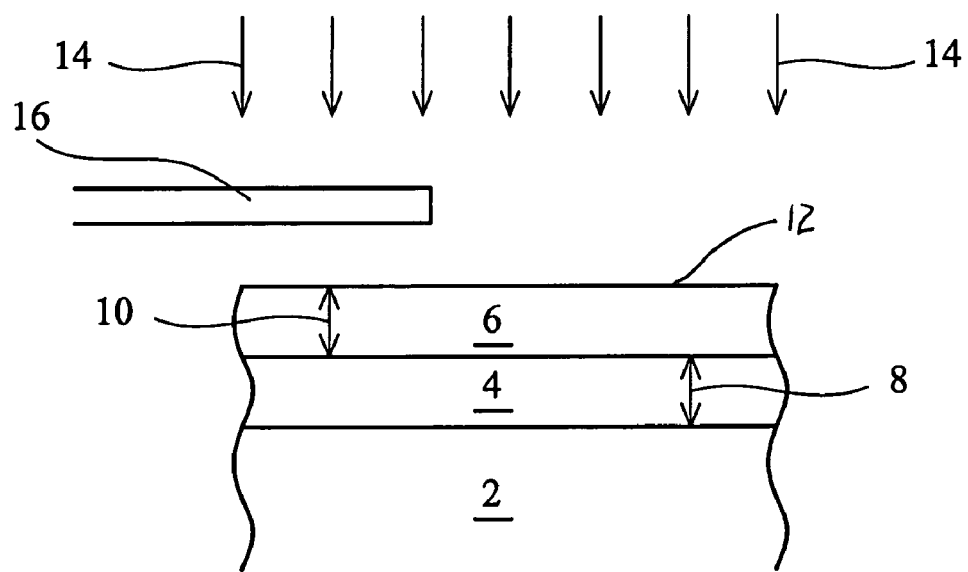
FIG. 1 shows an exemplary silicon/silicon-germanium/silicon heterostructure being heat treated by laser light.
Figure 2:
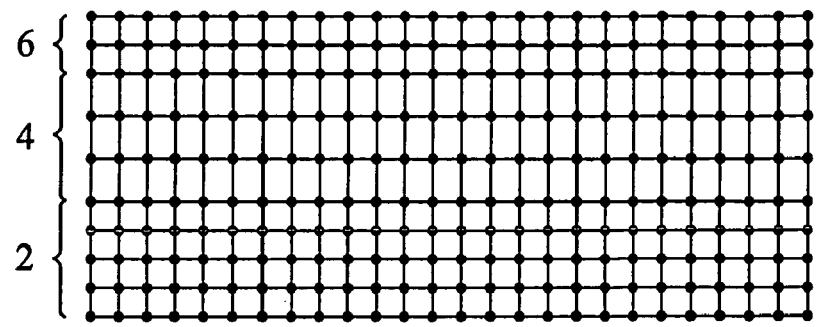
FIG. 2 schematically shows an atomic lattice of a single crystal silicon layer formed on a silicon-germanium layer formed on a silicon substrate layer.

FIG. 1 shows a cross-sectional view of an exemplary structure of the invention and FIG. 2 schematically shows an atomic lattice of the exemplary structure of the invention, as formed and prior to heat treatment. Additionally, FIG. 1 also shows an exemplary method of heat treatment in accordance with a method of the present invention. Referring to FIGS. 1 and 2, silicon-germanium layer 4 is formed over bottom Si layer 2. Bottom Si layer 2 may be a bulk silicon substrate or it may be the silicon layer of an SOI (silicon-on-insulator) substrate. In another embodiment, bottom Si layer 2 may be another silicon layer formed over a substrate. Silicon-germanium layer 4 is formed by epitaxial formation methods such as chemical vapor deposition (CVD) or molecular beam epitaxy (MBE), but various other epitaxial deposition methods may be used to form silicon-germanium film 4. The CVD-based epitaxial growth may take place at a temperature within the range of 800–1100° C. in an exemplary embodiment, and MBE methods typically utilize a lesser temperature. Thickness 8 of silicon-germanium layer 4 may be on the order of a few hundred angstroms. In one embodiment, thickness 8 may be less than 1200 angstroms and, in another embodiment, thickness 8 may be less than 500 angstroms, but other thicknesses may be used in other exemplary embodiments. As shown in FIG. 2, silicon-germanium layer 4 is substantially dislocation free upon formation and is under compressive stress upon formation. The degree of compressive stress may vary and depend upon thickness 8 of silicon-germanium film 4. The germanium concentration of the silicon-germanium film 4, represented by $Si_{1-x}Ge_x$, may vary and x may range from being substantially 0 to substantially 1.0. Germanium concentration x could be constant across silicon-germanium film 4 or there may be a Ge gradient as germanium concentration x may vary across silicon-germanium film 4.

An epitaxial growth process is then used to form top Si layer 6 over silicon-germanium layer 4. Various conventional epitaxial growth processes such as CVD or MBE may be used to form top Si layer 6. Thickness 10 of top Si layer 6 may range from 100 to 200 angstroms in an exemplary embodiment, and it may range from 100 to 500 angstroms in another exemplary embodiment, but other thicknesses may be used in other exemplary embodiments. Silicon-germanium layer 4 remains in compressive stress during the formation of top Si 6 layer, which is a single crystal silicon film in an exemplary embodiment. This single crystalline top Si layer 6 may serve as a Si channel in various applications in various semiconductor devices.

Prior to heat treating, the sandwich structure of $Si/Si_{1-x}Ge_x/Si$ may optionally be patterned such as to define active areas, for example. Conventional methods may be used. In one embodiment, only Si layer 2 is patterned; in another embodiment, Si layer 2 and silicon-germanium layer 4 are patterned; and in another embodiment, all three layers 2, 4 and 6 are patterned.

The sandwich structure of $Si/Si_{1-x}Ge_x/Si$ is then heat treated to selectively melt the $Si_{1-x}Ge_x$ as afforded by the lower melting point of silicon-germanium compared to that crystalline silicon. In an exemplary embodiment, crystalline silicon may have a melting point of around 1400° C. and silicon-germanium may have melting point of about 900° C., but the melting point of the $Si_{1-x}Ge_x$ will vary depending on the germanium concentration, i.e., the value of x. As the value of x increases, the disparity in relative melting points also increases. In one exemplary embodiment, the heat treating may be done by rapid thermal annealing, RTA. In another exemplary embodiment, laser annealing may be used. The laser may be pulsed or a continuous wave laser.

FIG. 1 shows laser light, indicated by arrows 14, directed toward surface 12 of the multi-layer semiconductor structure. Various lasers such as an XeCl or other excimer lasers may be used. The laser energy is adjusted to selectively melt silicon-germanium layer 4 but not top Si layer 6. Various energies may be used and may depend upon the germanium concentration of silicon-germanium layer 4. For a pulsed laser, the laser energy may further depend on the number and/or frequency of pulses used and the power density and energy are chosen in conjunction with thickness 8 silicon-germanium layer 4. In an exemplary embodiment, a laser power density in the range of 0.1 to 1.0 W/cm$^2$ may be used to melt about 1000 angstroms of silicon-germanium but other power densities may be used in other exemplary embodiments. The wavelength of laser light is chosen to be a wavelength that is absorbable by silicon and in exemplary embodiment, a wavelength less than 11000 Å may be used. The heat treatment process causes silicon-germanium layer 4 to substantially or completely melt while top Si layer 6 remains a solid single crystalline material. Prior to cooling, the heat treated silicon-germanium layer 4 may be in its completely or substantially molten state from its upper border with top Si layer 6 to its lower border with bottom Si layer 2.

According to the laser anneal heat treatment embodiment, the laser treatment may blanket the entire substrate or it may be spatially selective. According to the spatially selective embodiment, designated sections of silicon-germanium layer 4 may be subjected to and substantially melted by laser light and other sections may not. For example, only selected regions such as NMOS transistor regions may be laser annealed. In one embodiment, a narrow laser beam may be directed to desired portions of the substrate and in another exemplary embodiment, such as shown in FIG. 1, mask 16 may used to reflect and/or absorb laser light, indicated by arrows 14, and prevent laser annealing of underlying portions of the multi-layered structure.

Figure 3:
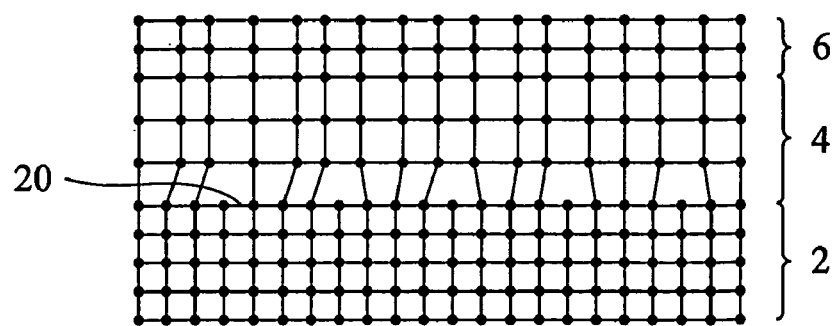
FIG. 3 schematically shows an atomic lattice of the single crystal silicon layer/silicon-germanium layer/silicon substrate layer structure, after heat treatment and cooling.

As a result of the heat treating operation, which may be a single and substantially continuous heat treating operation as described above, silicon-germanium layer 4 becomes relaxed. After this heat treating operation, the structure cools and the silicon-germanium layer 4 solidifies. Passive or active cooling techniques may be used. As silicon-germanium layer 4 cools and solidifies, this relaxed layer forces top Si layer 6 to expand and strain is created in top Si layer 6, which substantially continuously binds to silicon-germanium layer 4. Strained top Si Layer 6 may advantageously have a lattice constant essentially equal to that of the relaxed silicon-germanium layer 4, to which it binds. As such, after the heat treatment, including a subsequent cooling operation, the multilayer heterostructure includes strained top Si layer 6 disposed over relaxed, solidified silicon-germanium layer 4 which is disposed, in turn, over bottom silicon layer 2, as shown in FIG. 3. During and after the heat treatment process, dislocations 20 may occur as shown in FIG. 3, to enable silicon-germanium layer 4 to remain a relaxed film.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the structure be constructed or used in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor structure, comprising:
   providing a substrate having a silicon surface;
   epitaxially forming a stressed silicon-germanium layer on said silicon surface;
   epitaxially forming a silicon layer on said silicon-germanium layer; and
   heat treating thereby converting said stressed silicon-germanium layer to a relaxed silicon-germanium layer and creating strain in said silicon layer,
   wherein said heat treating comprises causing said silicon-germanium, layer but not said silicon layer, to melt, then cooling to solidify said silicon-germanium layer.

2. The method as in claim 1, wherein said heat treating is spatially selective.

3. The method as in claim 1, wherein said heat treating comprises one of rapid thermal annealing (RTA) and laser treatment.

4. The method as in claim 3, wherein said heat treating comprises said laser treatment and includes a power density of 0.1–1.0 W/cm$^2$.

5. The method as in claim 3, wherein said heat treating comprises one of continuous wave laser treatment and pulsed laser treatment.

6. The method as in claim 3, wherein said heat treatment comprises said laser treatment and includes a wavelength of less than 11000 angstroms.

7. The method as in claim 1, wherein said heat treating is a single heating operation followed by a cooling operation that simultaneously converts said stressed silicon-germanium layer to a relaxed silicon-germanium layer and creates strain in said silicon layer.

8. The method as in claim 1, wherein said epitaxially forming a stressed silicon-germanium layer comprises forming said stressed silicon-germanium layer to a thickness of less than 500 angstroms.

9. The method as in claim 1, wherein said epitaxially forming a silicon layer comprises epitaxially forming a single crystal silicon layer.

10. The method as in claim 9, wherein said epitaxially forming a silicon layer comprises epitaxially forming said single crystal silicon layer to a thickness within the range of 100 to 200 angstroms.

11. The method as in claim 1, wherein each of said epitaxially forming a stressed silicon-germanium layer and said epitaxially forming a silicon layer comprise one of chemical vapor deposition (CVD) epitaxy and molecular beam epitaxy (MBE).

12. The method as in claim 1, wherein said silicon layer substantially continuously binds to said silicon-germanium layer and said heat treatment includes cooling which causes said silicon layer to expand to substantially match a lattice constant of said silicon-germanium layer thereby causing said strain in said silicon layer.

13. The method as in claim 1, further comprising patterning at least said silicon layer and said silicon-germanium layer prior to said heat treating.

14. A method for forming a semiconductor structure, comprising:
    providing a silicon layer on a substrate;
    epitaxially forming an initially stressed silicon-germanium layer on said silicon layer;
    epitaxially forming a single crystal silicon layer on said silicon-germanium layer; and
    heat treating and cooling to convert said initially stressed silicon-germanium layer to a relaxed silicon-germanium layer and to create strain in said single crystal silicon layer,
    wherein said beat treating causes said silicon-germanium layer, but not said single crystal silicon layer, to melt then cooling to solidify said silicon-germanium layer.

15. The method as in claim 14, wherein said heat treating is spatially selective.

* * * * *

UNITED STATES PATENT AND TRADEMARK OFFICE
CERTIFICATE OF CORRECTION

| | |
|---|---|
| PATENT NO. | : 7,202,145 B2 |
| APPLICATION NO. | : 10/860165 |
| DATED | : April 10, 2007 |
| INVENTOR(S) | : Min Cao |

It is certified that error appears in the above-identified patent and that said Letters Patent is hereby corrected as shown below:

Column 6, line 45, delete "beat" and insert therefore -- heat --.

Column 6, line 46, delete "melt" and insert therefore -- melt, --.

Signed and Sealed this

Fourth Day of September, 2007

JON W. DUDAS
*Director of the United States Patent and Trademark Office*